United States Patent
Luo et al.

(10) Patent No.: US 8,943,028 B2
(45) Date of Patent: Jan. 27, 2015

(54) DATABASE COMPRESSION ANALYZER

(75) Inventors: Congnan Luo, San Diego, CA (US);
Like Gao, San Diego, CA (US); Yu Long, San Diego, CA (US); Judy Wu, San Diego, CA (US); Michael Leon Reed, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 688 days.

(21) Appl. No.: 12/826,004

(22) Filed: Jun. 29, 2010

(65) Prior Publication Data

US 2011/0320418 A1    Dec. 29, 2011

(51) Int. Cl.
*G06F 17/30* (2006.01)
*H03M 7/30* (2006.01)

(52) U.S. Cl.
CPC .......... *H03M 7/30* (2013.01); *G06F 17/30312* (2013.01)
USPC ...................................................... 707/693

(58) Field of Classification Search
CPC .................... G06F 17/30342; G06F 17/30477; H03M 7/30
USPC ...................................................... 707/693
See application file for complete search history.

(56) References Cited

U.S. PATENT DOCUMENTS

| | | | |
|---|---|---|---|
| 8,103,619 B1 * | 1/2012 | Reed et al. | 707/609 |
| 2008/0162521 A1 * | 7/2008 | Browning | 707/101 |
| 2008/0162523 A1 * | 7/2008 | Kraus et al. | 707/101 |
| 2008/0222136 A1 * | 9/2008 | Yates et al. | 707/5 |
| 2009/0043734 A1 * | 2/2009 | Barsness et al. | 707/3 |
| 2009/0043793 A1 * | 2/2009 | Barsness et al. | 707/101 |
| 2009/0150135 A1 * | 6/2009 | Cressman | 703/13 |
| 2009/0193041 A1 * | 7/2009 | Hornibrook et al. | 707/101 |
| 2010/0183021 A1 * | 7/2010 | Cloonan et al. | 370/412 |
| 2011/0029569 A1 * | 2/2011 | Ganesh et al. | 707/796 |

OTHER PUBLICATIONS

Article entitled "Compress Tool 2010", dated Jul. 24, 2009, by AtanaSuite.*
Article entitled "Make Room for Data", copyright 2009, by Teradata.*
Article entitled "AtanaSuite Enterprise", by AtanaSuite, Copyright 2009.*
Article entitled "AtanaSoft" by Teradata, dated Apr. 5, 2013.*
Article entitled "Better Tools for a Better Design" by Millard, dated Mar. 2007.*
Article entitled "Atanasoft CompressTool Screenshots" by Atanasoft, dated Apr. 5, 2013.*
Article entitled "Teradata Database13.10 Overview" by Walter, dated Apr. 2010 (See p. 15).*
WO 2010/017322 from Volkoff et al.*
AtanaSuite Options Tab Screenshot, by AtanaSuite.*

* cited by examiner

*Primary Examiner* — Mahesh Dwivedi
(74) *Attorney, Agent, or Firm* — Schwegman Lundberg & Woessner P.A.; Randy L. Campbell, Jr.

(57) ABSTRACT

Apparatus, systems, and methods may operate to receive requests to execute a plurality of compression and/or decompression mechanisms on one or more database objects; to execute each of the compression and/or decompression mechanisms, on a sampled basis, on the database objects; to determine comparative performance characteristics associated with each of the compression and/or decompression mechanisms; and to record at least some of the performance characteristics and/or derivative characteristics derived from the performance characteristics in a performance summary table. The table may be published to a storage medium or a display screen. Other apparatus, systems, and methods are disclosed.

20 Claims, 4 Drawing Sheets

100

110

| Object name | Compression _name | Compression ratio | Compression Cost | Decompression Cost | Write Saving | Read Saving | Time_to_ compress_decompress |
|---|---|---|---|---|---|---|---|
| PayrollDB. employee_ table.State | MVC | 5% | 0.7 | 0.1 | 1 | 0.8 | 10 |

120

| Object name | Compression _name | Compression ratio | Compression Cost | Decompression Cost | Write Saving | Read Saving | Time_to_ compress_decompress |
|---|---|---|---|---|---|---|---|
| PayrollDB. employee_ table | ALGO | 15% | 0.5 | 0.2 | 1 | 0.4 | 12 |

130

| Object name | Compression _name | Compression ratio | Compression Cost | Decompression Cost | Write Saving | Read Saving | Time_to_ compress_decompress |
|---|---|---|---|---|---|---|---|
| PayrollDB | ROW | 25% | 0.5 | 0.2 | 1 | 0.4 | 45 |

DATABASE COMPRESSION ANALYZER

COPYRIGHT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the example code, screen shots, and images described below, and in any drawings appended hereto: Copyright© 2010 Teradata, Inc. of Miamisburg, Ohio. All Rights Reserved.

BACKGROUND

It is not uncommon to see the data associated with a business venture grow at an exponential pace. Thus, a variety of techniques to compress large amounts of data have been developed to conserve storage resources. On the other hand, larger and less expensive disks have become increasingly available, as have multiple processors per node. Data compression has therefore also been used to enable keeping large amounts of data online, assisting with deep analysis and a reduction in input/output (I/O) cost. The existence and availability of various compression mechanisms, along with less expensive storage and processing, consequently pose a new challenge: how does a database administrator make intelligent choices among all the alternatives in an efficient manner?

DETAILED DESCRIPTION

To address the challenge described above, many embodiments operate to provide a tool, sometimes called a "compression analyzer," to generate a comparative report of available compression mechanisms. This tool lays the foundation for the provision of other intelligent tools that can assist the DBA (database administrator) in making informed compression decisions. For example, automatic selection of appropriate compression mechanisms can be made, perhaps based on a weighted formula applied to the report data.

In some embodiments, a new SQL (structured query language) statement is used to invoke a compression analyzer that samples the data in a database object (e.g., a database, a table, or a table column), using one or more specified compression mechanisms. The results are provided as estimated compression times based on the sampled data. One possible format for this statement is as follows:

```
COLLECT COMPRESS   <object_name>
[SAMPLE PERCENTAGE n |SAMPLE AMP n]
[MVC|ALGO|TEMPORAL|ROW|DATA BLOCK|ALL|SERIES]
         TO <result_table_name>
```

The database objects supported in the above SQL statement, and specified by the "<object name>" include at least the following:
a) a base table, as an existing populated base table, or perhaps created using a CREATE TABLE statement to provide a new table;
b) a non-unique index (NUSI), as an existing index, or perhaps one created using a CREATE INDEX statement;
c) a join Index with a single-table or multiple tables, using an existing join index, or perhaps created using a CREATE JOIN INDEX statement;
d) a materialized view; and/or
e) a database name, which may direct the compression analyzer to analyze any or all of the above objects being defined in a given database.

In some embodiments, a Data Dictionary table named "Compression_Method" is created. In this table, for each available compression mechanism in the DBMS (database management system), a row is inserted to record the default compression ratio, compression cost, decompression cost, and/or time used to accomplish the compression.

The user may specify the percentage of data sampling from the designated object, or choose Teradata® AMP (access module processor) sampling if the table is populated, for example. A higher percentage of data sampling may increase the time it takes to complete compression analysis, but may also provide more accurate results. In the case of no sampling, such as when the percentage of sampling is specified to be zero, a default value taken from the Compression_Method table can be used.

Once activated, the compression analyzer operates to determine which compression algorithms that exist in the DBMS should be applied, and then applies them to the sampled data. The user may specify which algorithms should be selected for use, or all of the available algorithms may be used (perhaps as a default condition). Compression may be applied in a specified order, one technique at a time, or in series, perhaps to achieve a cumulative result. For example, when "ALL" is specified in the COLLECT COMPRESS statement, the techniques are not applied cumulatively, as they may be when "SERIES" is specified. One possible order for the application of compression techniques is as follows:
a) MVC (Multi-Value Compression);
b) TEMPORAL (Temporal compression of Related Rows), applied when the target table is a temporal table;
c) ALGO (Algorithmic Compression), perhaps defined on a column-by-column basis;
d) ROW (User Specified Row Compression in a DBMS);
e) DATA BLOCK (Data block compression); and
f) Other techniques to be developed in the future.

For each compression technique, the compression analyzer may operate to record the average compression ratio and CPU (central processing unit) cost for compression and decompression on a data block basis. These recoded values, along with the estimated CPU and/or I/O write and read time savings, and the estimated time to compress the whole table or database object, can be inserted into the specified result table.

Data blocks may be used as a basic measurement unit in many embodiments, because they provide a relatively straightforward way to measure and compare processing cost. The size of a data block can be defined in the CREATE TABLE SQL statement. Often, tables are defined using 128 Kbytes per data block when the tables are mostly accessed for full table scan.

The results of the compression analyzer operation may be presented in the form of a table. One possible schema for such a result table is shown below:

```
Create table <result_table_name> (
object_name          VARCHAR(100),
compression_name     VARCHAR(50),
compression_ratio    int, //percent, measured via sampling
compress_cost        float, //msec, measured via sampling
decompression_cost   float, //msec, measured via sampling
Write_Saving         float, //msec, measured via sampling
Read_Saving          float, //msec, measured via sampling
time_to_compress     float, //minute, per specified object, estimated)
PRIMARY INDEX(object_name);
```

Figure 1:
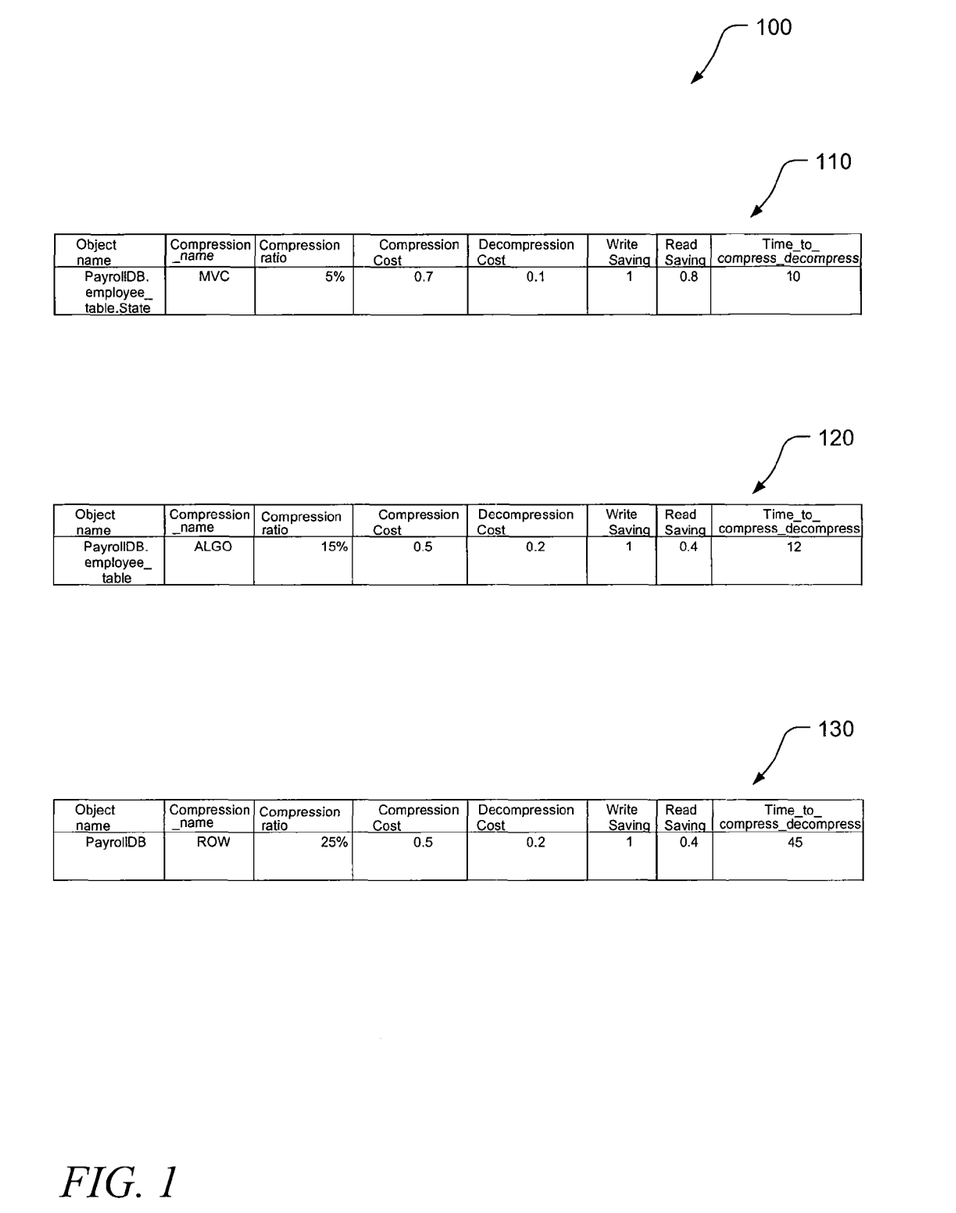
FIG. 1 is a set of examples of database compression analysis according to various embodiments of the invention.

FIG. 1 is a set 100 of examples 110, 120, 130 of database compression analysis according to various embodiments of the invention. In each case, the results of using the compression analyzer are presented in the form of a table, formatted according to the schema described previously. In many embodiments, other schema and other formats are used.

For example 110, the compression object is a column, and the SQL statement used to initiate analysis might be:

```
COLLECT COMPRESS PayrollDB.employee_table.State
    SAMPLE PERCENTAGE 10 MVC TO emp_cmpr_result;
```

In this case, the object name is PayrollDB.employee_table.State, the Compression type is MVC, and the compression ratio achieved is 5%. The compression cost is 0.7 msec per data block and the decompression cost is 0.1 msec per data block. The CPU write saving time is 1 msec per data block and the CPU read saving time is 0.8 msec per data block. The estimated time to compress and decompress the column PayrollDB.employee_table.State is 10 minutes.

For example 120, the compression object is a table, and the SQL statement used to initiate analysis might be:

```
COLLECT COMPRESS PayrollDB.employee_table
    SAMPLE PERCENTAGE 10 ALGO TO emp_cmpr_result;
```

In this case, the object name is PayrollDB.employee_table, the Compression type is ALGO, and the compression ratio achieved is 15%. The compression cost is 0.5 msec per data block and the decompression cost is 0.2 msec per data block. The CPU write saving time is 1 msec per data block and the CPU read saving time is 0.4 msec per data block. The estimated time to compress and decompress the table PayrollDB.employee_table is 12 minutes.

For example 130, the compression object is a database, and the SQL statement used to initiate analysis might be:

```
COLLECT COMPRESS PayrollDB
    SAMPLE PERCENTAGE 10 ROW TO emp_cmpr_result;
```

In this case, the object name is PayrollDB, the Compression type is ROW, and the compression ratio achieved is 25%. The compression cost is 0.5 msec per data block and the decompression cost is 0.2 msec per data block. The CPU write saving time is 1 msec per data block and the CPU read saving time is 0.4 msec per data block. The estimated time to compress the database PayrollDB is 45 minutes.

As shown, the compression analyzer can operate to translate I/O savings brought about by compression into an equivalent saving of processor cycle time. For example, the I/O cost realized by using a solid state disk versus the more traditional mechanical disk drive is usually significant.

As hardware evolves, the COLLECT COMPRESS statement described herein may be used to factor I/O cost in terms of CPU cycle cost according to a given configuration of hardware and storage components. In most cases, one I/O cycle may be specified by hardware architecture to be equivalent to M CPU cycles in a given hardware configuration (or N I/O cycles may be equivalent to one CPU cycle). In some embodiments, the equivalence of various I/O configurations and processor configurations may be contained in the Compression_Method table, or in some other table.

For example, an I/O operation using a solid state disk might be translated into 0.1 CPU cycles, versus that for a disk array platform, which translates into 0.5 CPU cycles, using a ratio of I/O to CPU cycles. As storage technology evolves, faster operations might be provided, with a speed of perhaps 0.001 CPU cycle per I/O cycle. In this case, the compression analyzer will be able to accommodate the newer technology, adjust to its performance, and provide the DBA with information (via the published results of analysis comparisons) to justify use of a particular hardware element, or upgrading to a new platform.

In another example, if the performance of available storage is greatly increased, the compression/decompression for a given table may no longer be compelling. The DBA in that case may decide to disable the compression/decompression for that table.

In a further example, the compression analyzer may show that the processing to access data in a given table using a disk array platform makes use of 1,000 I/O operations, which is equivalent to 500 CPU cycles. However, the total cost of accessing the same amount of data with compression and decompression may be only 50 CPU cycles. In this case, compression and decompression present a better choice because there is 450 CPU cycle saving.

As a matter of contrast, when the same table is moved to a new storage technology, such as Solid State Disk, the compression analyzer may determine that 1,000 I/O operations now are equivalent to only 10 CPU cycles, and compression and decompression is no longer compelling. The DBA may then decide to disable compression/decompression of the table.

Thus, compression cost in terms of time can be normalized based on CPU cycles, storage read time, storage write time, and other operations. The COLLECT COMPRESS statement described herein may include the ability to specify a particular type and number of processors, as well as storage components. In addition, as noted previously, combinations of compression methods may also be specified, including sequenced, cumulative application.

Therefore, many embodiments of the invention may be realized, and each can be implemented in a variety of architectural platforms, along with various operating and server systems, devices, and applications. Any particular architectural layout or implementation presented herein is therefore provided for purposes of illustration and comprehension only, and is not intended to limit the various embodiments.

Figure 2:
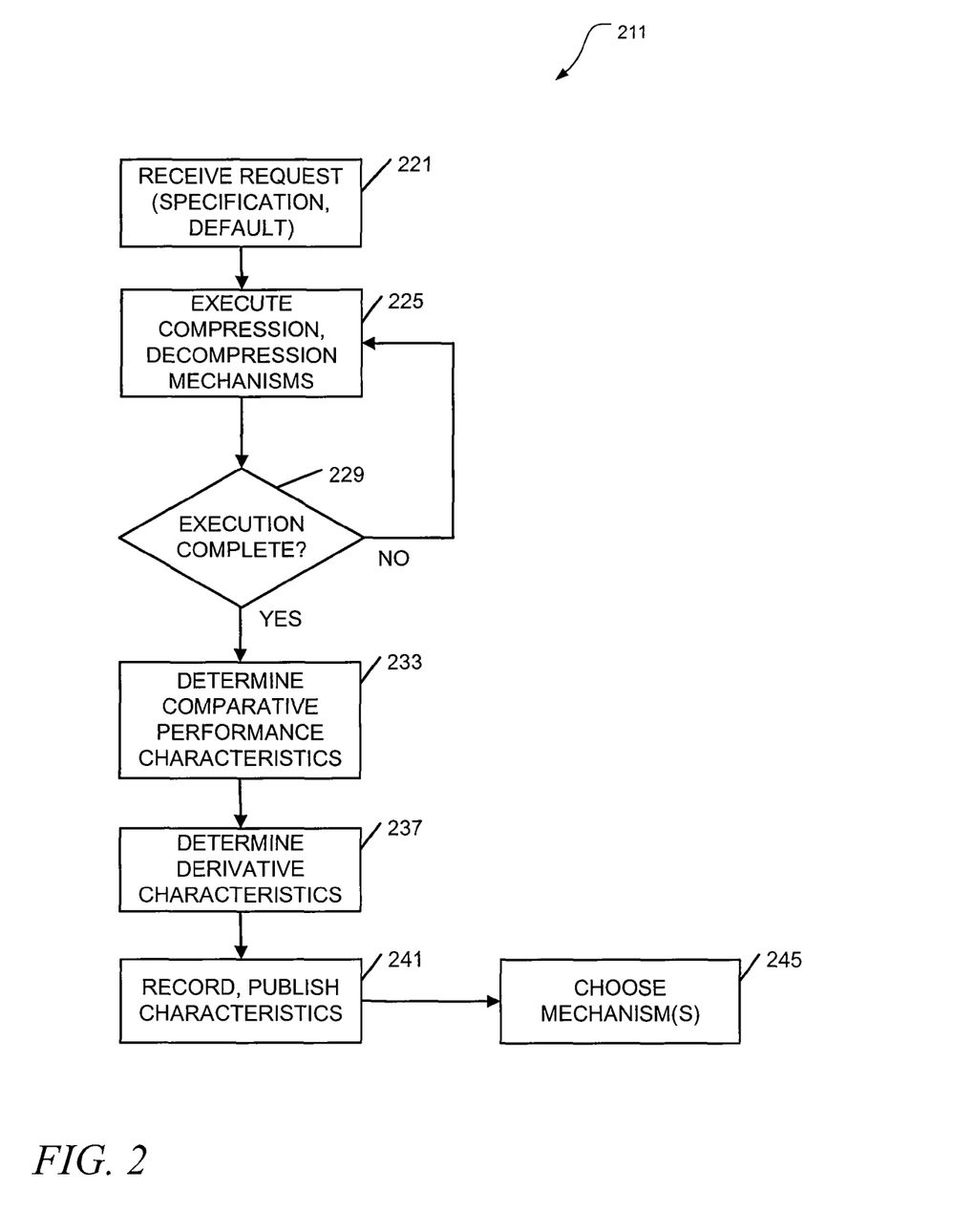
FIG. 2 is a flow diagram illustrating several methods of database compression analysis according to various embodiments of the invention.

FIG. 2 is a flow diagram illustrating several methods 211 of database compression analysis according to various embodiments of the invention. The methods 211 are implemented in a machine-accessible and readable medium, and are operational over processes within and among networks. The networks may be wired, wireless, or a combination of wired and wireless. The methods 211 may be implemented as instructions, which when accessed by a specific machine, perform the processing depicted in FIG. 2.

In some embodiments, a result table is created and published, using actual or derived performance characteristics for several compression and decompression mechanisms applied to a specified database object. The mechanisms and database object can each be user-specified, or determined via default values.

The performance characteristics enable comparison between the applied mechanisms. The published result table can be stored and/or displayed, with comparative performance characteristics that are associated with each of the compression and decompression mechanisms. In this way, the result table can be used to determine an appropriate compression and decompression mechanism (or combination of mechanisms) to be used for each database object. The ultimate choice may be made in an automated or manual fashion.

The publication destination can be a display screen, hard copy, or a storage medium. The results may be published in tabular form, to include characteristics that can be compared, such as compression ratio, cost, time savings, and estimated time to compress the database object (e.g., column, table, or database). Sampling and comparison can be invoked using a single SQL statement in some embodiments. The cost of using one or more compression algorithms may be presented as a normalized value, based on the available processing and storage technology.

Thus, a processor-implemented method 211 that can be executed on one or more processors that perform the method may begin at block 221 with receiving a request to execute a plurality of compression and/or decompression mechanisms on at least one database object.

The request can be received in the form of a SQL statement, with a default or user-selected array of compression mechanisms. Thus, the activity at block 221 may comprise receiving the request comprising the plurality of compression and/or decompression mechanisms as a plurality of user-selected compression and/or decompression mechanisms specified in a SQL statement.

The database object to be used for comparing compression mechanisms may constitute a number of types. For example, the database object may comprise one or more of a table, an index, a materialized view, or a database name, among others.

The request may including an explicit sampling specification, or in the alternative, provide a default sampling condition. Thus, the activity at block 221 may comprise receiving a sampling specification in the request, and when no sampling specification is received in the request, implementing a default sampling specification.

Sampling can be apportioned by explicitly noting a percentage of the data that is to be tested against the various compression mechanisms. Thus, the sampling specification may include a percentage of data to be sampled.

The task of sampling can also be distributed for execution by database processing modules, including virtual modules, such as Teradata® access module processors (AMPs). Thus, the sampling specification may include a sampling amount associated with one or more partial database processing modules.

The method 211 may continue on to block 225 with executing each of the compression and/or decompression mechanisms, on a sampled basis, on the database objects specified in the request.

In some embodiments, a default condition might be maintained, so that all compression mechanisms that are available on the system can be called into use for comparison. Thus, the compression and/or decompression mechanisms may comprise a default set of all mechanisms available on a system that accomplishes the execution.

The compression mechanisms can be tested in series, so that combinations of the mechanisms, providing a cumulative result, can be evaluated. Thus, the activity at block 225 may comprise executing more than one of the compression and/or decompression mechanisms, in a cumulative series, on one or more database objects.

As one or more compression mechanisms are tested, the method 211 may operate to determine whether execution of the various mechanisms is complete at block 229. If not, execution may continue at block 225. Otherwise, the method 211 may continue on to block 233 with determining comparative performance characteristics associated with each of the compression and/or decompression mechanisms.

The method 211 may also continue on to block 237 with determining derivative characteristics that are derived from the determined (sampled) performance characteristics.

For example, in some embodiments the method 211 includes determining normalized performance (e.g., given specific data processing limitations), so that a variety of processing platforms can be more readily compared. Normalization may be put into effect according to processing attributes, which are attributes of the apparatus and/or system that execute the compression mechanisms, and which affect data processing speed. These attributes may include hardware, software, and/or network characteristics. Thus, the activity at block 237 may comprise determining the derivative characteristics as a function of normalized processing attributes, perhaps comprising processor attributes and/or storage attributes.

Processor attributes may include various characteristics of processors that are used to execute the compression mechanisms. Thus, processor attributes may comprise one or more of processor speed, processor type, the number of processors, and/or the processor cache size.

Storage attributes may include various characteristics of storage media that are used during execution of the compression mechanisms. Thus, storage attributes may comprise one or more of the storage medium cache size, the storage medium type, network latency time, storage read speed, and/or storage write speed.

Thus, in summary, as part of the activity at block 237, one or more of the performance characteristics can be normalized as a function of processing attributes, processor technology attributes (e.g., single processor vs. multi-core), and/or storage medium technology attributes (e.g., physical disk vs. solid-state disk) to provide the derivative characteristics.

In some embodiments, the sampled performance characteristics can be extrapolated with respect to an entire database object, so that an estimate of the compression mechanism performance for the whole database object may be obtained. Thus, the activity at block 237 may comprise extrapolating the performance characteristics to provide the derivative characteristics with respect to the entire database object.

The method 211 may continue on to block 241 with recording at least some of the performance characteristics (and/or derivative characteristics derived from the performance characteristics) in a performance summary table.

As part of the activity at block 241, the table, or any of the data within the table, may be published to a storage medium, a display screen, etc. Thus, in some embodiments, the derivative characteristics can be published on a normalized basis, perhaps using processor cycles, data block size, data block processing time, or I/O performance as a meaningful way to provide relative comparisons between different processing systems.

The method 211 may go on to block 245 to include choosing one or more of the compression/decompression mechanisms for future application to the database object (e.g., as part of a customer installation). The choice may be made manually, or automatically.

The choice may be based on a function of the performance characteristics and/or derivative characteristics, such as by applying weights to one or more of the characteristics to produce a score. For example, one formula of choice might be implemented as SCORE=compression_ratio/T+ U*compression_cost+V*decompression_cost+ W*write_save_time+X*read_save_time+ Y*estimated_total_compression_time. In some cases, the mechanism producing the lowest (or highest) score may be selected for use on a permanent basis.

The methods described herein do not have to be executed in the order described, or in any particular order. Moreover, various activities described with respect to the methods identified herein can be executed in repetitive, serial, or parallel fashion. The individual activities of the methods shown in FIG. 2 can also be combined with each other and/or substituted, one for another, in various ways. Information, including parameters, commands, operands, and other data, can be sent and received in the form of one or more carrier waves. Thus, many other embodiments may be realized.

The methods shown in FIG. 2 can be implemented in various devices, as well as in a computer-readable storage medium, where the methods are adapted to be executed by one or more processors. Further details of such embodiments will now be described.

Figure 3:
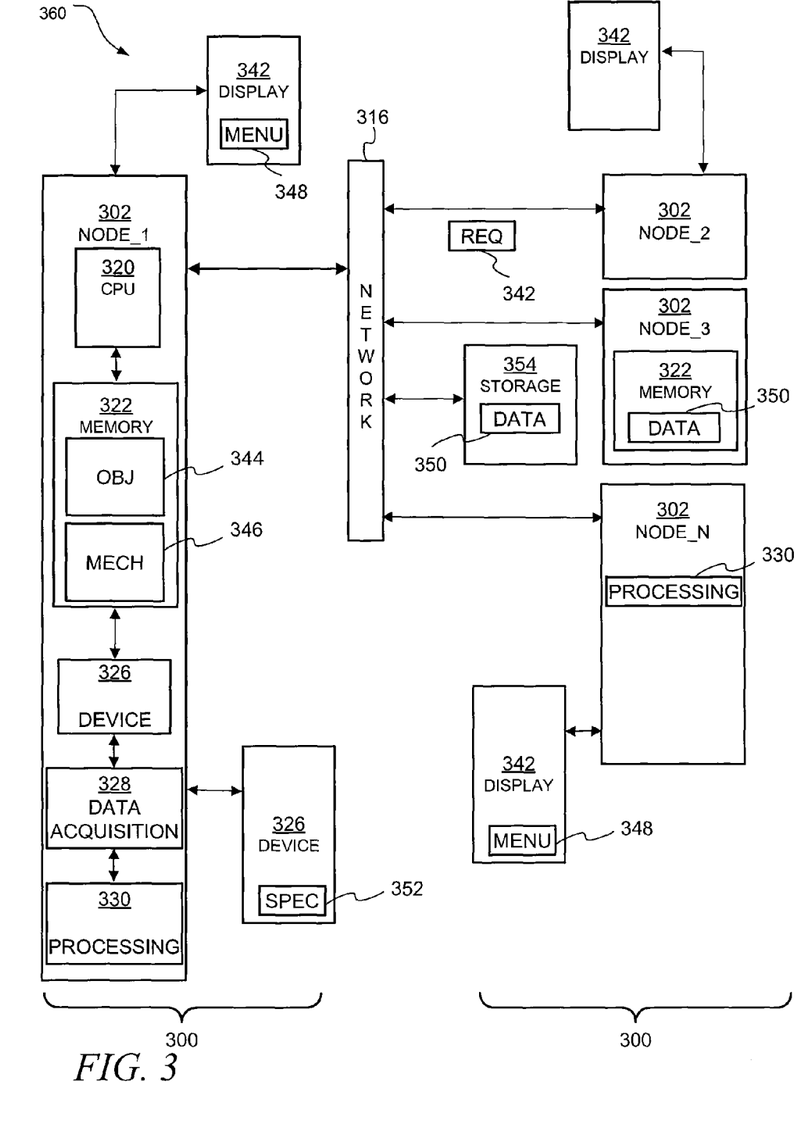
FIG. 3 is a block diagram of apparatus and systems according to various embodiments of the invention.

FIG. 3 is a block diagram of apparatus 300 and systems 360 according to various embodiments of the invention. Here it can be seen that an apparatus 300 used to implement database compression analysis may comprise one or more processing nodes 302, one or more processors 320, memories 322, one or more user input devices 326, a data acquisition module 328, a processing module 330, and one or more displays 342. The apparatus 300 may comprise a client, a server, or a networked processing node.

The processing nodes 302 may in turn comprise physical machines or virtual machines, or a mixture of both. The nodes 302 may also comprise networked entities, such as servers and/or clients. In some cases, the operations described herein can occur entirely within a single node 302.

In some embodiments then, an apparatus 300 may comprise a data acquisition module 328 to receive requests 342 to execute a plurality of compression and/or decompression mechanisms 346 on at least one database object 344. The apparatus 300 may further include a processing module 330 to execute each of the compression and/or decompression mechanisms 346, on a sampled basis, on specified database objects 344, as described previously.

A display 342 may be used to present a menu of compression mechanisms to the end-user for selection. Thus, the apparatus 300 may comprise one or more displays 342 to display a menu 348 of the compression and/or decompression mechanisms 346.

The apparatus 300 may include a storage node. Thus, the apparatus 300 may comprise a storage node 354 that includes the storage medium to which the data 350 in the table of results, or even the entire table, is published. Data 344 comprising a database object may also be stored in the storage node 354.

The apparatus 300 may divide its workload between multiple nodes. Thus, the apparatus 300 may comprise a first node (e.g., NODE_1) to house the data acquisition module 328, and one or more second nodes (e.g., NODE_N) to house the processing module 330.

A user input device 326 may be used by an end-user to determine the basis for sampling. Thus, the apparatus 300 may comprise a user input device 326 to transmit a sampling specification 352 to the data acquisition module 328, so that the sampling specification 352 can be used to determine the sampling basis.

Still further embodiments may be realized. For example, it can be seen that a system 360 that operates to implement database compression analysis may comprise multiple instances of the apparatus 300. The system 360 might also comprise a cluster of nodes 302, including physical and virtual nodes. It should be noted that any of the nodes 302 may include any one or more of the elements explicitly shown in nodes NODE_1, NODE_2, NODE_3, . . . NODE_N.

The apparatus 300 and systems 360 may be implemented in a machine-accessible and readable medium that is operational over one or more networks 316. The networks 316 may be wired, wireless, or a combination of wired and wireless. The apparatus 300 and system 360 can be used to implement, among other things, the processing associated with the methods 211 of FIG. 2. Modules may comprise hardware, software, and firmware, or any combination of these. Additional embodiments may be realized.

Figure 4:
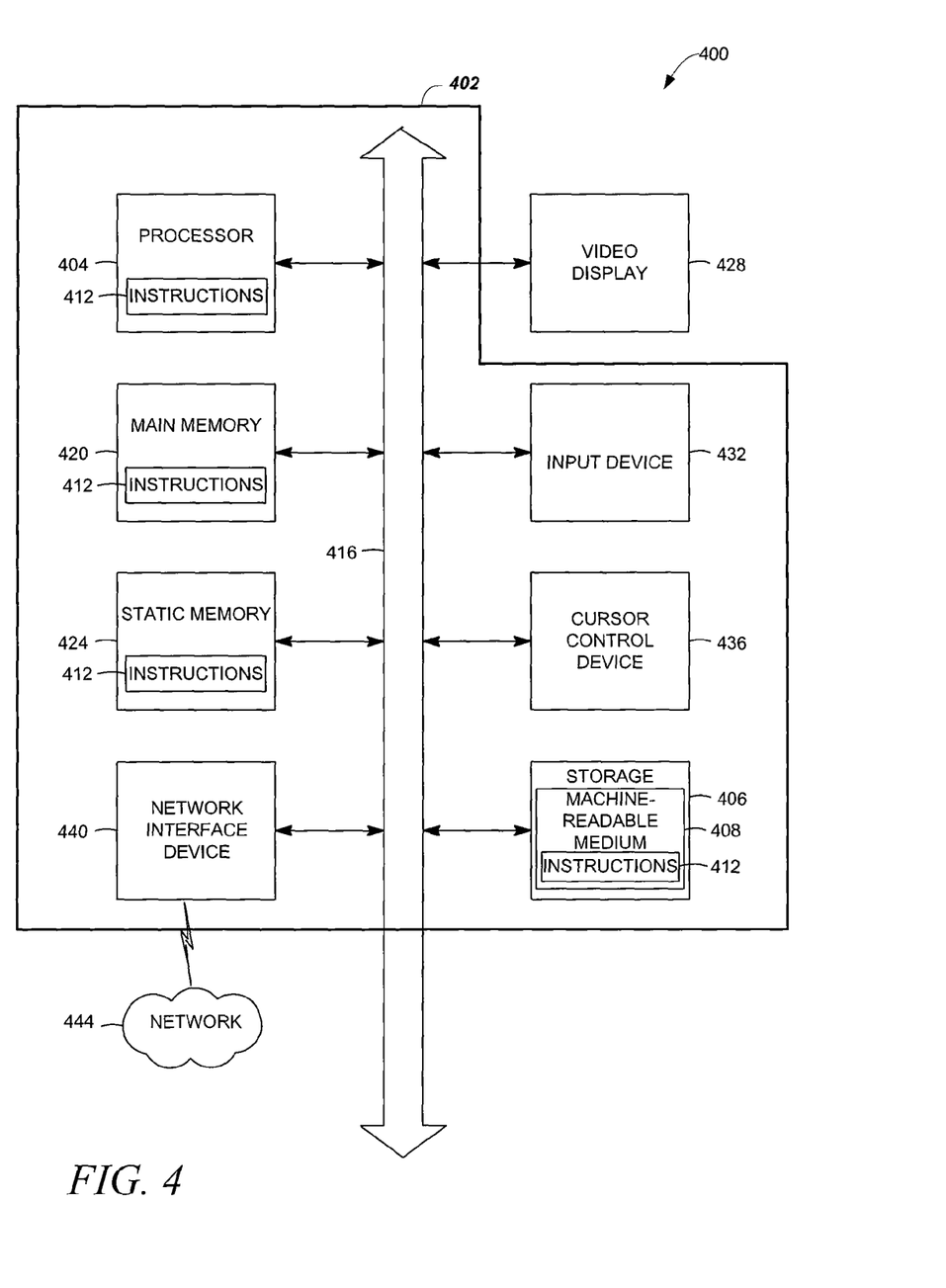
FIG. 4 is a block diagram of an article of manufacture, including a specific machine, according to various embodiments of the invention.

For example, FIG. 4 is a block diagram of an article 400 of manufacture, including a specific machine 402, according to various embodiments of the invention. Upon reading and comprehending the content of this disclosure, one of ordinary skill in the art will understand the manner in which a software program can be launched from a computer-readable medium in a computer-based system to execute the functions defined in the software program.

One of ordinary skill in the art will further understand the various programming languages that may be employed to create one or more software programs designed to implement and perform the methods disclosed herein. The programs may be structured in an object-oriented format using an object-oriented language such as Java or C++. Alternatively, the programs can be structured in a procedure-oriented format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment. Thus, other embodiments may be realized.

For example, an article 400 of manufacture, such as a computer, a memory system, a magnetic or optical disk, some other storage device, and/or any type of electronic device or system may include one or more processors 404 coupled to a machine-readable medium 408 such as a memory (e.g., removable storage media, as well as any memory including an electrical, optical, or electromagnetic conductor) having instructions 412 stored thereon (e.g., computer program instructions), which when executed by the one or more processors 404 result in the machine 402 performing any of the actions described with respect to the methods above.

The machine 402 may take the form of a specific computer system having a processor 404 coupled to a number of components directly, and/or using a bus 416. Thus, the machine 402 may be similar to or identical to the apparatus 300 or system 360 shown in FIG. 3.

Turning now to FIG. 4, it can be seen that the components of the machine 402 may include main memory 420, static or non-volatile memory 424, and mass storage 406. Other components coupled to the processor 404 may include an input device 432, such as a keyboard, or a cursor control device 436, such as a mouse. An output device 428, such as a video display, may be located apart from the machine 402 (as shown), or made as an integral part of the machine 402.

A network interface device 440 to couple the processor 404 and other components to a network 444 may also be coupled to the bus 416. The instructions 412 may be transmitted or received over the network 444 via the network interface device 440 utilizing any one of a number of well-known transfer protocols (e.g., HyperText Transfer Protocol). Any of these elements coupled to the bus 416 may be absent, present singly, or present in plural numbers, depending on the specific embodiment to be realized.

The processor 404, the memories 420, 424, and the storage device 406 may each include instructions 412 which, when executed, cause the machine 402 to perform any one or more of the methods described herein. In some embodiments, the machine 402 operates as a standalone device or may be connected (e.g., networked) to other machines. In a networked environment, the machine 402 may operate in the capacity of a server or a client machine in server-client network environment, or as a peer machine in a peer-to-peer (or distributed) network environment.

The machine 402 may comprise a personal computer (PC), a tablet PC, a set-top box (STB), a PDA, a cellular telephone, a web appliance, a network router, switch or bridge, server, client, or any specific machine capable of executing a set of instructions (sequential or otherwise) that direct actions to be taken by that machine to implement the methods and functions described herein. Further, while only a single machine 402 is illustrated, the term "machine" shall also be taken to include any collection of machines that individually or jointly execute a set (or multiple sets) of instructions to perform any one or more of the methodologies discussed herein.

While the machine-readable medium 408 is shown as a single medium, the term "machine-readable medium" should be taken to include a single medium or multiple media (e.g., a centralized or distributed database, and/or associated caches and servers, and or a variety of storage media, such as the registers of the processor 404, memories 420, 424, and the storage device 406 that store the one or more sets of instructions 412). The term "machine-readable medium" shall also be taken to include any medium that is capable of storing, encoding or carrying a set of instructions for execution by the machine and that cause the machine 402 to perform any one or more of the methodologies of the present invention, or that is capable of storing, encoding or carrying data structures utilized by or associated with such a set of instructions. The terms "machine-readable medium" or "computer-readable medium" shall accordingly be taken to include tangible media, such as solid-state memories and optical and magnetic media.

Various embodiments may be implemented as a standalone application (e.g., without any network capabilities), a client-server application or a peer-to-peer (or distributed) application. Embodiments may also, for example, be deployed by Software-as-a-Service (SaaS), an Application Service Provider (ASP), or utility computing providers, in addition to being sold or licensed via traditional channels.

Implementing the apparatus, systems, and methods described herein may operate to provide statistics with respect to an available compression technique applied to a specified database object, as well as to deliver a broader perspective, with a comparison of different compression techniques applied to the same object. The use of the tool provided may simplify database administration by collecting statistics on different database objects using different compression techniques, assisting in the determination of an appropriate compression scheme from among many that are available. Increased efficiency with respect to processing large amounts of data, and improved DBA satisfaction may result.

This Detailed Description is illustrative, and not restrictive. Many other embodiments will be apparent to those of ordinary skill in the art upon reviewing this disclosure. The scope of embodiments should therefore be determined with reference to the appended claims, along with the full scope of equivalents to which such claims are entitled.

The Abstract of the Disclosure is provided to comply with 37 C.F.R. §1.72(b) and will allow the reader to quickly ascertain the nature of the technical disclosure. It is submitted with the understanding that it will not be used to interpret or limit the scope or meaning of the claims.

In this Detailed Description of various embodiments, a number of features are grouped together in a single embodiment for the purpose of streamlining the disclosure. This method of disclosure is not to be interpreted as an implication that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
   a processor;
   a data acquisition module executable by the processor to receive a single request to execute, on a sampled basis, a plurality of compression and/or decompression mechanisms on at least one database object; and
   a processing module executable by the processor to:
   execute each of the compression and/or decompression mechanisms, on the sampled basis, on the at least one database object;
   determine comparative performance characteristics associated with each of the compression and/or decompression mechanisms;
   determine derivative characteristics associated with each of the compression and/or decompression mechanisms based on the comparative performance characteristics, wherein the derivative characteristics include normalization of processing characteristics of at least one candidate system configured to perform the compression and/or decompression mechanisms, wherein the normalization of processing techniques of the candidate system is relative to other systems configured to perform the plurality of compression and/or decompression mechanisms; and
   record at least some of the comparative performance characteristics and/or derivative characteristics in a performance summary table to be published to at least one of a tangible storage medium or a display screen.

2. The apparatus of claim 1, further comprising:
   a display to display a menu of the compression and/or decompression mechanisms.

3. The apparatus of claim 1, further comprising:
   a storage node that includes the tangible storage medium.

4. The apparatus of claim 1, further comprising:
   a storage node to store the database object.

5. The apparatus of claim 1, further comprising:
a first node to house the data acquisition module; and
at least one second node to house the processing module.

6. The apparatus of claim 1, further comprising:
a user input device to transmit a sampling specification to the data acquisition module, the sampling specification to determine the sampling basis.

7. A processor-implemented method to execute on one or more processors that perform the method, comprising:
receiving, with the one or more processors, a single request to execute, on a sampled basis, a plurality of compression and/or decompression mechanisms on at least one database object;
executing, with the one or more processors, each of the compression and/or decompression mechanisms, on the sampled basis, on the at least one database object;
determining, with the one or more processors, comparative performance characteristics associated with each of the compression and/or decompression mechanisms;
determining, with the one or more processors, derivative characteristics associated with each of the compression and/or decompression mechanisms based on the comparative performance characteristics, wherein the derivative characteristics include normalization of processing characteristics of at least one candidate system configured to perform the compression and/or decompression mechanisms, wherein the normalization of processing characteristics of the candidate system is relative to other systems configured to perform the plurality of compression and/or decompression mechanisms;
recording, with the one or more processors, at least some of the comparative performance characteristics and/or derivative characteristics in a performance summary table to be published to at least one of a tangible storage medium or a display screen; and
selecting, with the one or more processors, a compression and/or decompression mechanism to perform compression and/or decompression of the at least one database object based on at least one of the determined comparative performance characteristics and the determined derivative characteristics.

8. The method of claim 7, wherein the receiving comprises:
receiving, with the one or more processors, the request comprising the plurality of compression and/or decompression mechanisms as a plurality of user-selected compression and/or decompression mechanisms specified in a structured query language (SQL) statement.

9. The method of claim 7, wherein the database object comprises one of a table, an index, a materialized view, or a database name.

10. The method of claim 7, wherein the compression and/or decompression mechanisms comprise a default set of all mechanisms available on a system that accomplishes the executing.

11. The method of claim 7, wherein the receiving further comprises:
receiving, with the one or more processors, a sampling specification in the request; and
when no sampling specification is received in the request, implementing, with the one or more processors, a default sampling specification.

12. The method of claim 11, wherein the sampling specification includes a percentage of data to be sampled.

13. The method of claim 7, wherein the sampling specification includes a sampling amount associated with at least one partial database processing module.

14. The method of claim 7, further comprising:
extrapolating, with the one or more processors, the comparative performance characteristics to provide the derivative characteristics with respect to the entire database object.

15. A processor-implemented method to execute on one or more processors that perform the method, comprising:
receiving, with the one or more processors, a single request to execute, on a sampled basis, a plurality of compression and/or decompression mechanisms on at least one database object;
executing, with the one or more processors, each of the compression and/or decompression mechanisms, on the sampled basis, on the at least one database object;
determining, with the one or more processors, comparative performance characteristics associated with each of the compression and/or decompression mechanisms;
determining, with the one or more processors, derivative characteristics associated with each of the compression and/or decompression mechanisms based on the comparative performance characteristics, wherein the derivative characteristics include normalization of processing characteristics of at least one candidate system configured to perform the compression and/or decompression mechanisms, wherein the normalization of processing techniques of the candidate system is relative to other systems configured to perform the plurality of compression and/or decompression mechanisms; and
recording, with the one or more processors, the derivative characteristics in a performance summary table to be published to at least one of a tangible storage medium or a display screen.

16. The method of claim 15, further comprising:
determining, with the one or more processors, the derivative characteristics as a function of the normalized processing attributes comprising at least one of processor attributes or storage attributes.

17. The method of claim 16, wherein the processor attributes comprise:
at least one of a processor speed, a processor type, a number of processors, and/or a processor cache size.

18. The method of claim 16, wherein the storage attributes comprise:
at least one of a tangible storage medium cache size, a tangible storage medium type, a network latency time, a storage read speed, or a storage write speed.

19. The method of claim 15, wherein the derivative characteristics are published in terms of processor cycles, data block processing time, or input/output performance.

20. The method of claim 15, wherein the executing, with the one or more processors, comprises:
executing, with the one or more processors, more than one of the compression and/or decompression mechanisms, in a cumulative series, on the at least one database object.

* * * * *